(12) United States Patent
Kasamatsu (10) Patent No.: US 8,030,183 B2
(45) Date of Patent: Oct. 4, 2011

(54) METHOD FOR REDUCING CRYSTAL DEFECT OF SIMOX WAFER AND SIMOX WAFER

(75) Inventor: Ryusuke Kasamatsu, Saga (JP)

(73) Assignee: Sumco Corporation, Tokyo (JP)

( * ) Notice: Subject to any disclaimer, the term of this patent is extended or adjusted under 35 U.S.C. 154(b) by 151 days.

(21) Appl. No.: 12/551,958

(22) Filed: Sep. 1, 2009

(65) Prior Publication Data

US 2010/0084743 A1   Apr. 8, 2010

(30) Foreign Application Priority Data

Sep. 8, 2008  (JP) ................................ 2008-229584
Nov. 11, 2008  (JP) ................................ 2008-288612

(51) Int. Cl.
*H01L 21/32* (2006.01)
(52) U.S. Cl. .................. 438/473; 438/407; 257/E29.109
(58) Field of Classification Search .................. 438/407, 438/423, 311, 513, 766; 257/617, E29.109, 257/E29.318
See application file for complete search history.

(56) References Cited

U.S. PATENT DOCUMENTS

| | | | | |
|---|---|---|---|---|
| 6,043,166 A * | 3/2000 | Roitman et al. | ............ | 438/766 |
| 6,531,375 B1 * | 3/2003 | Giewont et al. | ............ | 438/407 |
| 7,067,402 B2 * | 6/2006 | Matsumura et al. | ......... | 438/480 |
| 7,410,877 B2 * | 8/2008 | Aoki et al. | .................. | 438/311 |
| 7,884,000 B2 * | 2/2011 | Aoki et al. | .................. | 438/528 |
| 2009/0057811 A1 | 3/2009 | Murakami et al. | | |
| 2009/0130816 A1 | 5/2009 | Takahashi et al. | | |

OTHER PUBLICATIONS

J. Jablonski et al., "Gettering Layer Formation in Low-Dose SIMOX Wafers", Proceedings 1995 IEE International SOI Conference, Oct. 1995, pp. 34-35.

* cited by examiner

*Primary Examiner* — Roy Potter (74) *Attorney, Agent, or Firm* — Greenblum & Bernstein, P.L.C.

(57) ABSTRACT

The method includes: a first step of colliding ions implanted from a surface of a SIMOX wafer into a silicon layer underneath a BOX layer against crystal defects to destroy the crystal defects; and a second step of heating the wafer obtained in the first step to recrystallize the silicon layer. If the ions to be implanted into the silicon layer are oxygen ions, then the first step initiates ion implantation with the temperature of the SIMOX wafer being 50° C. or lower, and sets an ion dose to $5 \times 10^{15}$ atoms/cm$^2$ to $1.5 \times 10^{16}$ atoms/cm$^2$ and implantation energy to 150 keV or higher but not higher than 220 keV. Consequently, crystal defects present in the silicon layer underneath the BOX layer of the SIMOX wafer are reduced.

13 Claims, 4 Drawing Sheets

METHOD FOR REDUCING CRYSTAL DEFECT OF SIMOX WAFER AND SIMOX WAFER

BACKGROUND OF THE INVENTION

1. Field of the Invention

The present invention relates to a method for reducing the crystal defects in a SIMOX (Separation by IMplanted OXygen) wafer and to the SIMOX wafer and, more particularly, to a technique for reducing crystal defects present in a silicon layer underneath a buried oxide film of the SIMOX wafer.

2. Description of the Related Art

Conventionally, as one of methods for manufacturing an SOI (Silicon On Insulator) wafer, a SIMOX method has been known, in which oxygen ions are implanted from at least one of the surfaces of a silicon wafer, and then a high-temperature heat treatment is performed, thereby forming a buried oxide film (hereinafter referred to as a BOX (Buried Oxide) layer) by the implanted oxygen ions. The SIMOX wafer thus manufactured is generally shipped to a device manufacturer with a surface oxide film removed. A surface SOI layer and a BOX layer thereunder are utilized in a device manufacturing process.

Incidentally, it has been reported in recent years that, in a high-temperature heat treatment process of a SIMOX wafer manufacturing step, a multitude of crystal defects, i.e., vacancy-type stacking faults (SF) are left behind within a silicon layer underneath a BOX layer when an oxygen precipitate within the wafer vanishes. For example, refer to J. Jablonski and other two, "LETTERING LAYER FORMATION IN LOW-DOSE SIMOX WAFERS," Proceedings 1995 IEEE International SOI Conference, October 1995, pp. 34-35.

In this regard, the silicon layer (silicon substrate) underneath the BOX layer has hardly been utilized conventionally in a device manufacturing process. Therefore, no measures have been taken against stacking faults remaining in the silicon layer.

SUMMARY OF THE INVENTION

However, the crystal defects remaining in the silicon layer underneath the BOX layer have become an issue that can no longer be ignored due to the miniaturization of devices. A first reason for this is that a usable portion of a wafer in a device manufacturing process is not limited to a conventional SOI layer and a BOX layer but has been extended to include the silicon layer underneath the BOX layer. This is a trend seen along with, for example, the extreme thinning of the BOX layer.

A second reason is that the miniaturization of devices has progressed. This means that, as the dimension of design rule is reduced to, for example, 45 nm or smaller, an extremely short-time (several seconds) heat treatment, such as laser spike anneal (hereinafter referred to as LSA) having a short heat treatment time, has been introduced, in order to control the temperature of a wafer as a whole at the time of high-temperature heat treatment and thereby reduce a diffusion distance. That is, in a heat treatment by means of LSA, laser light is emitted to a surface of the wafer to heat the surface and thereby the temperature is raised and lowered rapidly. Consequently, a temperature difference arises in the thickness direction of the wafer, thus causing thermal stress. This makes the wafer prone to a crystal defect, particularly a slip dislocation. Here, if many crystal defects remain in the silicon layer underneath the BOX layer of an SOI wafer, at the time of LSA-based heat treatment, many slip dislocations occur in the silicon layer. As a result, there may arise the warpage deformation of the wafer due to internal strain. Such the warpage deformation of the wafer adversely affects a device process and may cause a yield to degrade.

Hence, it is an object of the present invention to reduce crystal defects present in a silicon layer underneath the BOX layer of a SIMOX wafer.

A first aspect of the present invention is a method for reducing crystal defects present in a silicon layer underneath the buried oxide film of a SIMOX wafer, the method including: a first step of implanting ions from a surface of the SIMOX wafer into the silicon layer underneath the buried oxide film; and a second step of heating the SIMOX wafer following this first step.

In the first step, it is possible to implant ions energized so as to reach from a boundary between the buried oxide film and the silicon layer underneath this buried oxide film to a region at a preset depth of the silicon layer underneath the buried oxide film. In general, crystal defects present in the silicon layer underneath the buried oxide film collectively exist within a range of the silicon layer from the boundary between the buried oxide film and the silicon layer to a preset depth of the silicon layer. In addition, a crystal defect takes the form of a vacancy-type stacking fault, such as a quadrangular pyramid or a tetrahedron, thus differing from the single-crystal structure of a normal silicon layer. Accordingly, in the present invention, a predetermined amount of ions is first implanted to a predetermined depth position. Consequently, some of the implanted ions collide with crystal defects, thereby making it easy to restore the crystallinity of crystal defects in a subsequent heat treatment. Subsequently, the ion-implanted SIMOX wafer is heat-treated to restore the crystallinity of crystal defects remaining in the silicon layer underneath the buried oxide film and vanish vacancy-type stacking faults.

Here in the first step, it is necessary to provide, as implantation energy, such a degree of energy to ions as to cause the ions to reach to at least a preset depth of the SIMOX wafer. Consequently, ions that have reached the preset depth collide with crystal defects and the kinetic energy of the ions acts on the crystal defects in such a direction as to collapse the form thereof. Accordingly, by subsequently performing a high-temperature heat treatment to provide thermal energy to the crystal defects, it is possible to easily restore the crystallinity thereof. Note here that the temperature conditions and the dose of ion implantation relate to the amount of reduction in crystal defects. Therefore, the implantation temperature may be controlled and the dose may be set consistently with the density of targeted crystal defects.

More specifically, the method includes: a first step of colliding ions implanted into the silicon layer underneath the buried oxide film from a surface of the SIMOX wafer against crystal defects to destroy the crystal defects; and a second step of heating the SIMOX wafer following this first step to recrystallize the silicon layer. As described above, by destroying the crystal defects and then heating the SIMOX wafer up to a recrystallization temperature of the silicon layer, it is possible to more effectively restore the crystallinity of the crystal defects.

In this case, ions implanted in the first step differ in the degree of impact inflicted on the crystal defects, depending on the size (weight), the magnitude of implantation energy, and the like of the ions. In this regard, ions to be implanted are desirably those of one of elements, from hydrogen to argon, in the periodic table of the elements, taking into consideration the cost of ion implantation equipment, effects exerted on device quality, and the like.

In addition, the second step is intended to heat the SIMOX wafer to a temperature of 1150° C. or higher but not higher than 1350° C. By heating the SIMOX wafer to such a high-temperature, the recrystallization of crystal defects is allowed to progress easily also in terms of thermodynamics. Thus, it is possible to restore crystallinity in a short period of time.

If the ions to be implanted into the silicon layer underneath the buried oxide film in the first step are oxygen ions, then ion implantation is initiated with the temperature of the SIMOX wafer being 50° C. or lower. In addition, an ion dose is set to $5 \times 10^{15}$ atoms/cm$^2$ to $1.5 \times 10^{16}$ atoms/cm$^2$ and implantation energy is set to 150 keV or higher but not higher than 220 keV.

That is, the ion dose is set according to the density of crystal defects remaining in the silicon layer underneath the buried oxide film, and the like. In addition, the implantation energy is set according to the type of ion element, an implantation depth, and the like. By carrying out the first step under such conditions as described above, it is possible to destroy most of crystal defects present in the silicon layer underneath the buried oxide film. Here in the first step, the temperature of a pre-ion implantation SIMOX wafer is preferably low and is desirably set to, for example, 50° C. or lower, in order to retain the form of crystal defects broken by colliding ions against the defects.

Furthermore, in order to evaluate the ion implantation conditions of the above-described first aspect of the present invention, the present inventors implanted oxygen ions from a surface of a SIMOX wafer into a silicon layer underneath a buried oxide film on the basis of the above-described ion implantation conditions of the present invention, and examined this ion-implanted SIMOX wafer with respect to the oxygen concentration distribution of a depth region 200 nm deep from a boundary between the BOX layer and the silicon layer. The examination revealed that the oxygen concentration distribution is biased in the depth direction thereof. Accordingly, the present inventors have conceived that, if an oxygen concentration distribution can be made uniform in the depth direction of the silicon layer underneath the BOX layer, it is possible to further reduce crystal defects. Thus, the present inventors have accomplished the invention to be described hereinafter.

That is, a second aspect of the present invention is intended to divide an ion implantation step into a plurality of sub-steps in the first step of the first aspect, so as to vary implantation energy at each time of ion implantation. By doing so, it is possible to supply ions while distributing the ions in the depth direction in a predetermined depth region of the silicon layer underneath the buried oxide film. Thus, it is possible to make an oxygen concentration distribution uniform in the depth direction.

Here, in order to confirm the effect of reducing crystal defects in accordance with the second aspect, a sum of doses at the respective times of ion implantation in the second aspect was first made to agree with the dose at the time of ion implantation in the first aspect. Then, ion implantation was performed a plural number of times with different amounts of implantation energy. After that, an examination was made of an oxygen concentration distribution in the depth direction in a predetermined depth region of the silicon layer underneath the buried oxide film. Then, it was confirmed that the oxygen concentration distribution was made uniform. Next, this SIMOX wafer was heat-treated and an examination was made of the density of crystal defects in a predetermined depth region of the silicon layer underneath the buried oxide film. Then, it was confirmed that the density of crystal defects decreased, compared with the density in the first aspect. Accordingly, it has proved that, by implanting ions separately a plural number of times with different amounts of implantation energy into a predetermined depth region of the silicon layer underneath the buried oxide film and thereby making the oxygen concentration distribution uniform in the depth direction, it is possible to reduce crystal defects with higher efficiency. In addition, it has been confirmed that, since the oxygen concentration distribution can be made uniform by performing ion implantation a plural number of times with different amounts of implantation energy as described above, the second aspect has the advantage of being able to decrease the total dose of ions to be implanted to reduce crystal defects.

In this case, if the ions implanted into the silicon layer underneath the buried oxide film are, for example, oxygen ions, then the first step initiates ion implantation with the temperature of the SIMOX wafer being 50° C. or lower, and sets conditions at the respective times of ion implantation, so that the ion dose is $1 \times 10^{15}$ atoms/cm$^2$ to $1.5 \times 10^{16}$ atoms/cm$^2$ and the implantation energy is 150 keV to 220 keV. Here, the ion dose is determined according to the density of crystal defects remaining in the silicon layer, the frequency of ion implantation, and the like. The implantation energy is determined according to the type of ion element, an implantation depth, and the like. By carrying out the first step under such conditions as described above, it is possible to efficiently destroy crystal defects present in the silicon layer underneath the buried oxide film. In addition, in the first step, the temperature of a pre-ion implantation SIMOX wafer is preferably low and is desirably set to, for example, 50° C. or lower, in order to retain the form of crystal defects broken by colliding ions against the defects.

A SIMOX wafer of the present invention is characterized in that the density of vacancy-type crystal defects in a range from a boundary between a buried oxide film formed within the SIMOX wafer and a silicon layer underneath this buried oxide film to a depth of 200 nm of the silicon layer is $1 \times 10^7$/cm$^2$ or lower.

DETAILED DESCRIPTION OF THE INVENTION

Hereinafter, preferred embodiments of the present invention will be described with reference to the accompanying drawings.

First Embodiment

FIG. 1 is a schematic view used to explain a method for reducing the crystal defects in a SIMOX wafer to which a first embodiment of the present invention is applied. The method for reducing the crystal defects in accordance with the present invention is intended for a SIMOX wafer manufactured using a SIMOX method. The method for manufacturing the SIMOX wafer is constituted by including a step of implanting oxygen ions into a silicon wafer and a step of performing a predetermined heat treatment on this silicon wafer. Any SIMOX wafers can be covered by the present invention as long as the wafers are manufactured by including these steps, even if the conditions of the respective steps differ. Consequently, SIMOX wafers manufactured using an MLD (Modified Low Dose) method, an ITOX (Internal Thermal OXidation) method, and the like can also be covered by the present invention.

In the present embodiment, an explanation will be made by taking, as an example, a SIMOX wafer manufactured using an MLD-SIMOX method. Since the MLD-SIMOX method is a heretofore-known method, the manufacturing method is briefly described here and the specific manufacturing conditions thereof will be excluded from the description as appropriate.

In the MLD-SIMOX method, oxygen ions are separately implanted twice and thus oxygen atoms are implanted into a silicon wafer set to a different temperature at each time of ion implantation, thereby forming two ion-implanted layers in different states within the silicon wafer, one being a high-concentration oxygen layer and the other being an amorphous layer. Then, this silicon wafer is subjected to a high-temperature oxidation treatment in a mixed-gas atmosphere.

First, a predetermined amount of oxygen ions is implanted in a first ion implantation step with the silicon wafer heated, thereby forming a first ion-implanted layer having a high concentration within the silicon wafer. Next, a predetermined amount of oxygen ions is implanted with this silicon wafer cooled, thereby forming a second ion-implanted layer in an amorphous state, so as to be successive to the front surface side of the first ion-implanted layer of the silicon wafer. Then, the temperature of this silicon wafer is raised in an atmosphere of inert gas, such as argon, containing a predetermined amount of oxygen, and then the silicon wafer is held at a high temperature in an inert gas atmosphere in which an oxygen concentration has been raised. Consequently, the first ion-implanted layer turns into a BOX layer. During temperature rise, recrystallization does not smoothly progress in the second ion-implanted layer since the second ion-implanted layer contains high-concentration oxygen within the amorphous layer. Consequently, the second ion-implanted layer turns into a high-density defect layer. Oxygen is likely to precipitate in a region in which this defect layer is formed. Accordingly, oxygen within the atmosphere diffuses into the silicon wafer and gathers in the defect layer as an oxygen precipitate, as the result of the silicon wafer being held at a high temperature in an oxygen atmosphere. Thus, the defect layer turns into a BOX layer. According to this method, it is possible to form a BOX layer thicker than expected from the amount of implanted oxygen.

The BOX layer is formed within the SIMOX wafer manufactured by going through such steps as described above, and an SOI layer and a silicon layer to serve as a silicon substrate are formed on the upper side (front surface side) and the lower side (rear surface side) of the BOX layer, respectively. In addition, a surface oxide film is formed on the SOI layer, i.e., on a surface of the SIMOX wafer. Note that in the description given below, the phrase "silicon layer," if simply termed as is, refers to the silicon layer underneath the BOX layer.

Incidentally, at the time of manufacture using such a SIMOX method as described above, oxygen implanted into the silicon wafer precipitates as an oxide within the silicon wafer. And, it has been reported that, as oxygen diffuses and the precipitate vanishes at the time of the high-temperature heat treatment of the silicon wafer, a vacancy-type stacking fault (SF) from which crystal lattices are missing occurs in the silicon layer underneath the BOX layer. As previously discussed, such a crystal defect, i.e., a vacancy-type stacking fault (hereinafter abbreviated as an SF) adversely affects a device process and causes a yield to degrade.

Hence, using a TEM (transmission electron microscope), the present inventors first observed a cross section of the silicon layer in a SIMOX wafer obtained by the above-described method. Then, it was confirmed that SFs had been collectively formed in a range from a boundary between the BOX layer and the silicon layer to a depth of approximately 200 nm of the silicon layer. A close examination of the structures of SFs showed that the SFs were composed of two types of forms, i.e., SFs of an approximately 50 nm-high quadrangular pyramidal type and SFs of an approximately 10 nm-high tetrahedral type. In addition, SF densities were $2 \times 10^6/\text{cm}^2$ to $4 \times 10^6/\text{cm}^2$ for the quadrangular pyramids and $5 \times 10^8/\text{cm}^2$ to $10 \times 10^8/\text{cm}^2$ for the tetrahedrons. Here, an SF density refers to the number of crystal defects per unit area in a plane parallel to a plane direction of the SIMOX wafer at an arbitrary depth within the above-described depth region.

The first embodiment of the present invention is intended to provide the below-described method, in order to reduce such SFs as described above and improve the qualify of a silicon layer. That is, the method for reducing vacancy-type SFs in the first embodiment of the present invention is constituted by including: a step of implanting ions from a surface of a SIMOX wafer into a silicon layer at a preset depth from a BOX layer; and a heat treatment step of heating the SIMOX wafer obtained in this step and restoring the crystallinity of sites into which ions have been implanted.

Hereinafter, the first embodiment to which the present invention is applied will be described in detail for respective steps separately.

Figure 1A:
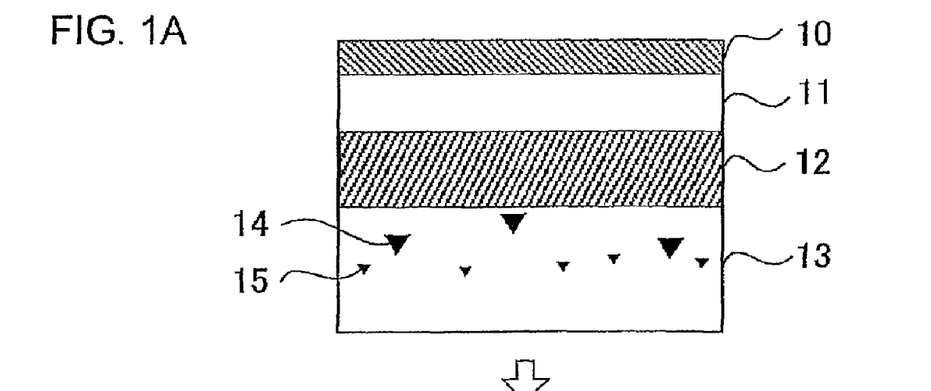
FIG. 1 is a schematic view used to explain a method for reducing the crystal defects in a SIMOX wafer to which a embodiment of the present invention is applied.

As illustrated in FIG. 1A, the SIMOX wafer is comprised of a surface oxide film 10, an SOI layer 11, a BOX layer 12, and a silicon layer 13 (silicon substrate) in the order from the upper surface side of the wafer. In the silicon layer 13, SFs 14 having a form of quadrangular pyramid and SFs 15 having a form of tetrahedron are scattered about in a layer-like manner over a range from a boundary between the BOX layer 12 and the silicon layer 13 to a preset depth of the silicon layer. In this case, it is assumed, for example, that the thickness of the surface oxide film is 0 nm to 200 nm, the thickness of the SOI layer is 10 nm to 100 nm, and the thickness of the BOX layer is 10 nm to 200 nm.

(Surface Oxide Film)

The oxide film on the surface may not be present, but is preferably present as a mask for particles. In addition, the thickness of the surface oxide film can be adjusted according to a depth of ion implantation. For the surface oxide film, it is possible to use a film obtained by etching an oxide film formed at the time of annealing performed to form the SIMOX wafer. Alternatively, the surface oxide film may be newly formed.

(Ion Implantation Step)

Figure 1B:
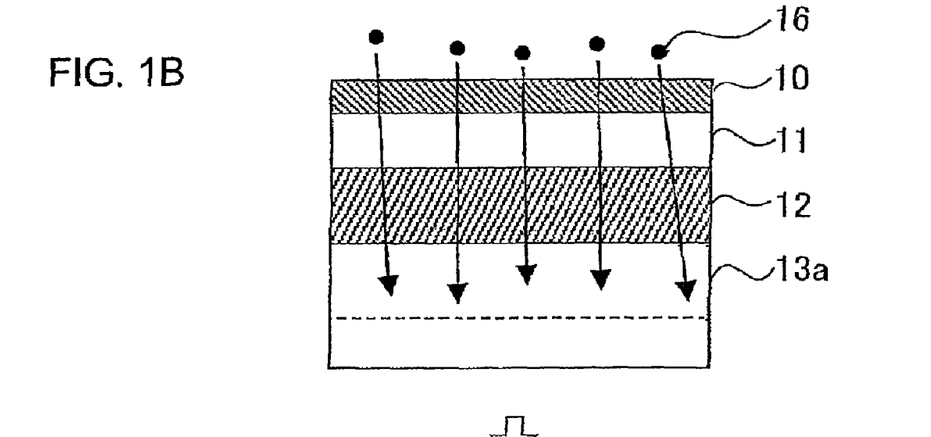

An ion implantation step is carried out in the manner that the obtained SIMOX wafer is cleaned, dried, and then housed in an ion implantation apparatus. In a vacuum state of the apparatus, oxygen ions 16 are implanted from a surface of the SIMOX wafer thereinto to collide the oxygen ions against the SFs 14 and 15, as illustrated in FIG. 1B, thereby destroying the crystal structures of the SFs 14 and 15.

Here, the oxygen ions 16 are provided with energy necessary to reach at least a depth region 13a of the silicon layer 13, in order to cause the oxygen ions 16 to collide against the SFs 14 and 15 present in the silicon layer 13 after being implanted into the SIMOX wafer. The depth region 13a is a region at a depth of, for example, 200 nm from a boundary between the BOX layer 12 and the silicon layer 13. Accordingly, the implantation energy of the oxygen ions 16 is preferably, for example, 150 keV to 220 keV. By allowing the oxygen ions implanted into the SIMOX wafer to reach the depth region 13a in this way, some of the oxygen ions 16 are made to collide against the SFs 14 and 15. Consequently, the crystal structure of the SFs having vacancy-type stacking faults is more or less collapsed and, desirably, the defect structure of the SFs is completely destroyed.

The oxygen ion dose is determined depending on the defect density of SFs 14 and 15 present in the depth region 13a, and is preferably, for example, $5 \times 10^{15}$ atoms/cm$^2$ to $1.5 \times 10^{16}$ atoms/cm$^2$. The reason for this is that doses smaller than $5 \times 10^{15}$ atoms/cm$^2$ are too small amounts of implantation for crystal structures to be fully broken. Thus, there may arise the problem that, even if a subsequent heat treatment step is carried out, SFs having uncorrected crystal defects remain in large quantity. Another reason is that doses larger than $1.5 \times 10^{16}$ atoms/cm$^2$ cause the amount of oxygen ions implanted into the silicon layer 13 to increase. Thus, there may arise the problem that, for example, an oxygen precipitate remains in the silicon layer 13 even after a heat treatment.

The temperature of the SIMOX wafer is preferably low, for example, at 50° C. or lower at the time of (or prior to) oxygen ion implantation. The reason for this is that, when ion implantation is initiated, the temperature of the SIMOX wafer rises and recrystallization progresses during implantation, thus making it no longer possible to fully vanish defects.

In the present embodiment, an explanation has been made of an example in which oxygen ions are implanted. However, since the purpose of ion implantation is to collide ions implanted into the SIMOX wafer against SFs to destroy the crystal structure thereof, the same effect can be obtained by implanting ions of an element other than oxygen. In this case, it is most preferable to implant the Si element itself. However, it is preferable to implant ions of such an element as argon or neon which is an inert gas not influential on devices. Here, the selected element needs to be provided with such implantation energy as to reach at least the depth region 13a of the silicon layer 13. For example, an amount of implantation energy larger than that provided to oxygen ions needs to be provided to elements heavier than oxygen. Conversely, for elements lighter than oxygen, it is possible to make the amount of implantation energy smaller than that provided to oxygen ions. In addition, in order to destroy crystal structures, it is necessary to adjust a dose. Note that although the implantation energy has been set to 150 keV to 220 keV, a required depth decreases as the film thicknesses of an SOI layer and a BOX layer become increasingly thinner and, therefore, the implantation energy also needs to be lowered according to the depth.

(Heat Treatment Step)

Figure 1C:
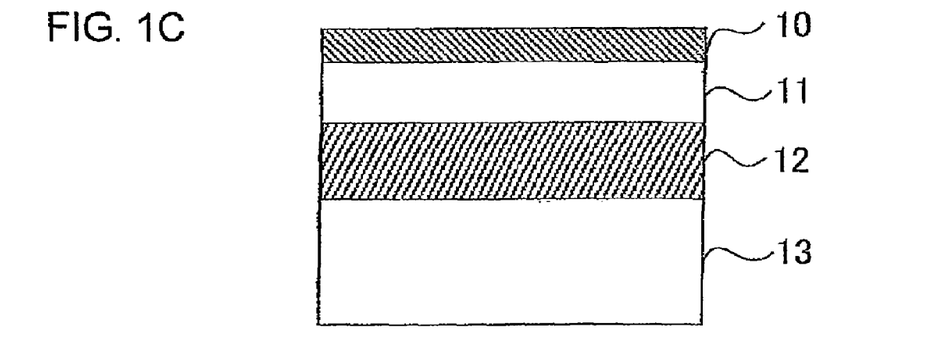

A heat treatment step is carried out in the manner that a SIMOX wafer taken out of an ion implantation apparatus is cleaned, dried, and then housed in a heat treatment furnace. Then, a high-temperature heat treatment is performed on the SIMOX wafer in an oxygen-containing atmosphere. Thus, the crystallinity of SFs 14 and 15 having broken defect structures is restored. That is, the defect structures are turned into the normal crystal structure of the silicon layer 13.

Here, the heat treatment step is required to heat the SIMOX wafer to a temperature necessary to at least restore the crystallinity of the SFs 14 and 15 having broken defect structures. Accordingly, the SIMOX wafer is heated to, for example, the recrystallization temperature of the silicon layer 13. Specifically, the internal temperature of the furnace is raised to 1150° C. or higher but lower than the melting point of silicon, preferably to 1150° C. to 1350° C. The SIMOX wafer is retained inside for 1 to 5 hours with this temperature maintained, and then cooled down to room temperature. The reason for this is that heat treatment temperatures lower than 1150° C. cause such a problem as that an oxygen precipitate remains or the restoration of crystallinity is inadequate because the heating temperature of the silicon layer 13 is low. Also note that an atmosphere inside the furnace during temperature rising is a mixed atmosphere composed of an inert gas, such as argon, nitrogen or the like, containing 0 to 5.0 volume % of oxygen. By applying a high-temperature heat treatment to the post-ion implantation SIMOX wafer in this way, the defect structure of SFs, the original crystal structure of which is at least collapsed in the ion implantation step, is restored to a normal crystal structure of the silicon layer, as illustrated in FIG. 1C.

As described above, according to the present embodiment, vacancy-type SFs present in the silicon layer of the SIMOX wafer are restored to the normal crystal structure of the silicon layer. Consequently, no problems are caused even if the silicon layer is utilized for a device in a device manufacturing process. In addition, it is possible to suppress the occurrence of slips and thereby prevent the warpage deformation of a wafer even if such an extremely short-time heat treatment as LSA is applied to the wafer. As a result, it is possible to suppress a degradation in the yield of devices.

Hereinafter, an explanation will be made specifically of examples in the first embodiment of the present invention, though the present invention is not limited to these examples.

Example 1

Figure 2:
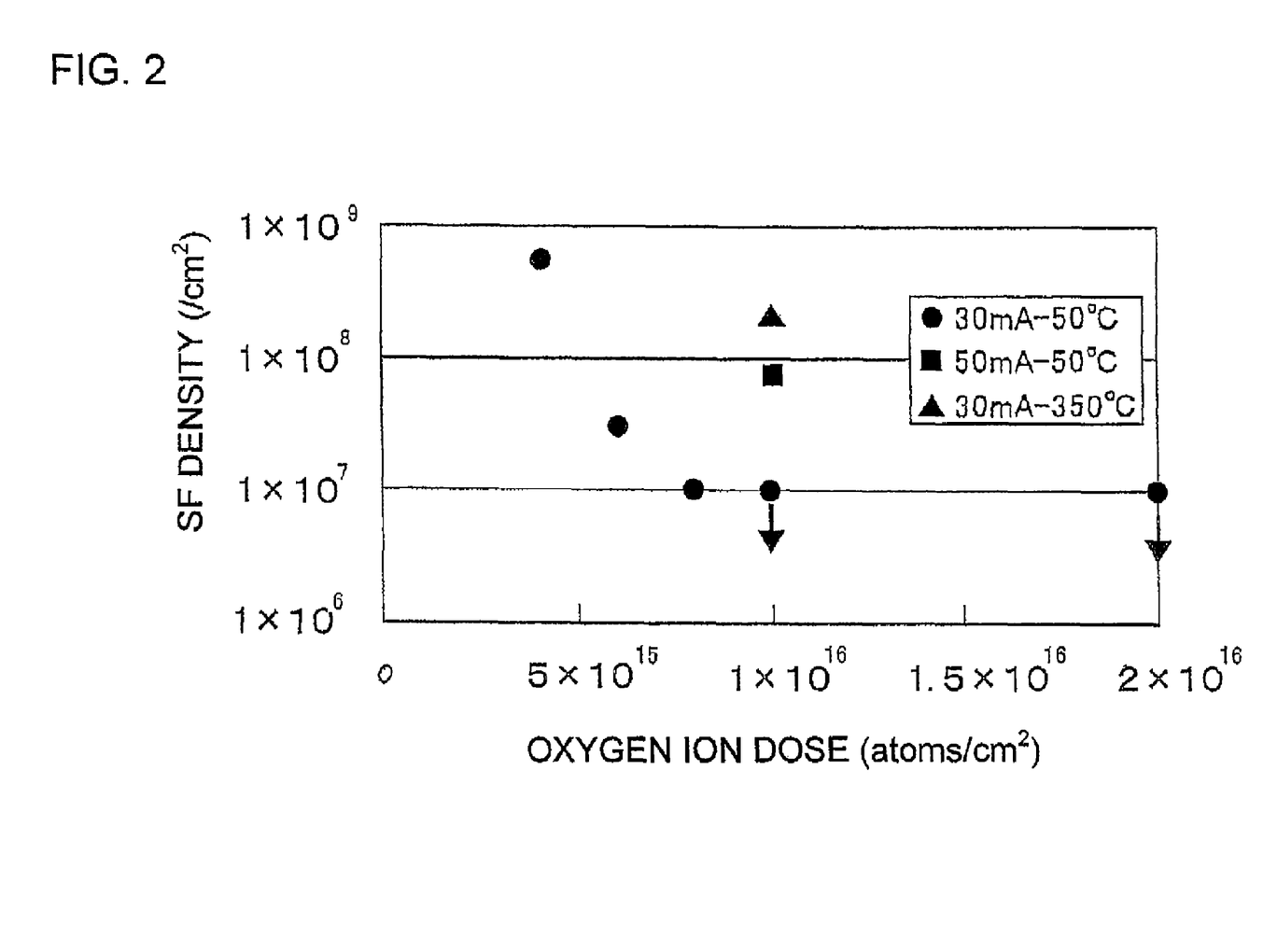
FIG. 2 is a graphical view used to explain a relationship between a dose of oxygen ions implanted into a SIMOX wafer and an SF density.

FIG. 2 is a graphical view used to explain a relationship between the dose of oxygen ions implanted into a SIMOX wafer and an SF density. The horizontal axis of the figure represents an oxygen ion dose (atoms/cm$^2$) and the vertical axis represents the SF density (/cm$^2$) of a depth region of a silicon layer. Here, the depth region refers to a region 200 nm deep from a boundary between a BOX layer and the silicon layer.

In the present example, a prepared SIMOX wafer was first cleaned and dried, and then housed in an ion implantation apparatus to maintain the temperature of the SIMOX wafer at 50° C. Then, implantation energy was fixed to 216 keV and, under five test conditions in which ion doses were $4 \times 10^{15}$ atoms/cm$^2$, $6 \times 10^{15}$ atoms/cm$^2$, $8 \times 10^{15}$ atoms/cm$^2$, $1 \times 10^{16}$ atoms/cm$^2$ and $2 \times 10^{16}$ atoms/cm$^2$, oxygen ions were implanted for the respective test conditions. Here, a current value detected by a current detection section of the ion implantation apparatus at the time of ion implantation was 30 mA.

Subsequently, the post-ion implantation SIMOX wafer taken out of the ion implantation apparatus was cleaned and dried, and then housed in a heat treatment furnace to raise the temperature of the wafer to 1200° C. The SIMOX wafer was retained inside for one hour with this temperature maintained, and then cooled down to room temperature. Next, using a TEM (approximately 60000× magnification), an observation was made of the SIMOX wafer taken out of the heat treatment furnace with respect to a transverse section and a longitudinal section of a silicon layer in the depth region thereof.

The result of evaluating the SF density from the number of SFs confirmed by images of this TEM is represented by the symbol ○ and is shown in FIG. 2. From the result of FIG. 2, it was confirmed that the SF density decreased along with an increase in the oxygen ion dose. It was also confirmed that, when the oxygen ion dose was set to $1\times10^{16}$ atoms/cm$^2$ or larger, SFs disappeared from a TEM image and the SF density decreased to a value lower than $1\times10^7$/cm$^2$.

Example 2

Next, oxygen ions were implanted (at a current value of 30 mA) into a pre-ion implantation SIMOX wafer with the temperature thereof raised to 350° C., by setting the implantation energy to 216 keV and the oxygen ion dose to $1\times10^{16}$ atoms/cm$^2$. Thus, there was evaluated the SF density of the SIMOX wafer treated under the same heat treatment conditions as those in Example 1. The result of this evaluation is represented by the symbol Δ and is shown in FIG. 2. From the result of FIG. 2, it was confirmed that if the temperature of a pre-ion implantation wafer was made higher, the decrement of the SF density reduced. The reason for this is that, as the result of ion implantation being performed at a high temperature, SFs do not fully vanish since recrystallization progresses during implantation. Accordingly, it is preferable to maintain the temperature of a pre-ion implantation SIMOX wafer at 50° C. or lower.

Example 3

Next, under the same test conditions as those in Example 1, there was evaluated the SF density of a SIMOX wafer when a current value at the time of ion implantation was 50 mA. The result of this evaluation is represented by the symbol □ and is shown in FIG. 2. From the result of FIG. 2, it was confirmed that if the current value at the time of ion implantation became higher, the decrement of the SF density reduced. The reason for this is that, if the current value becomes higher, the wafer temperature at the time of ion implantation becomes higher. Consequently, SFs do not fully vanish, since recrystallization progresses during implantation as the result of ion implantation being performed at a high temperature, as in Example 2. Accordingly, it is necessary to control the temperature at the time of implantation by the current value, an implantation time, and the like at the time of implantation, according to the implantation energy and the dose.

Second Embodiment

Subsequently, an explanation will be made of a second embodiment of a method for reducing the crystal defects in a SIMOX wafer to which the present invention is applied. The second embodiment differs from the above-described first embodiment only in the ion implantation step and, therefore, constituent elements that coincide with those of the first embodiment will not be explained again.

A method for reducing the vacancy-type SFs in accordance with the second embodiment of the present invention is constituted by including: an ion implantation step of implanting ions a plural number of times from a surface of a wafer toward a depth region of a silicon layer at a preset depth from a BOX layer; and a heat treatment step of heating the wafer obtained in the ion implantation step to restore the crystallinity of sites into which ions have been implanted. Here, the ion implantation step is set so that amounts of implantation energy at the respective times of ion implantation differ from one another.

In the ion implantation step, the dose of oxygen ions 16 is determined according to the defect density of SFs 14 and 15 present in a depth region 13a. For example, the dose is preferably set within a range from $1\times10^{15}$ atoms/cm$^2$ to $1.5\times10^{16}$ atoms/cm$^2$ at the respective times of ion implantation. The reason for this is that doses smaller than $1\times10^{15}$ atoms/cm$^2$ are too small amounts of implantation for crystals to be fully broken. Thus, there may arise the problem that, even if a subsequent heat treatment step is carried out, SFs having uncorrected crystal defects remain in large quantity. Another reason is that doses larger than $1.5\times10^{16}$ atoms/cm$^2$ cause the amount of oxygen ions implanted into the silicon layer 13 to increase. Thus, there may arise the problem that, for example, an oxygen precipitate remains in the silicon layer 13 even after a heat treatment.

Here, the implantation of oxygen ions 16 is performed separately a plural number of times, preferably three times, and the implantation energy is set so as to vary every time implantation is performed. The implantation energy may be set so as to decrease in a stepwise manner or may be set so as to increase in a stepwise manner, within the above-described range. By varying the implantation energy and repeating ion implantation in this way, it is possible to implant oxygen ions 16 in the depth direction of the depth region 13a while distributing the ions therein, and ensure the implanted amount of oxygen ions 16 which is uniform in the depth direction. Consequently, the efficiency of collision between oxygen ions 16 and SFs 14 and 15 improves. Thus, it is possible to improve the rate of reduction in SFs after heat treatment.

Hereinafter, an explanation will be made specifically of examples in the second embodiment of the present invention, though the present invention is not limited to these examples.

Example 4

Figure 3:
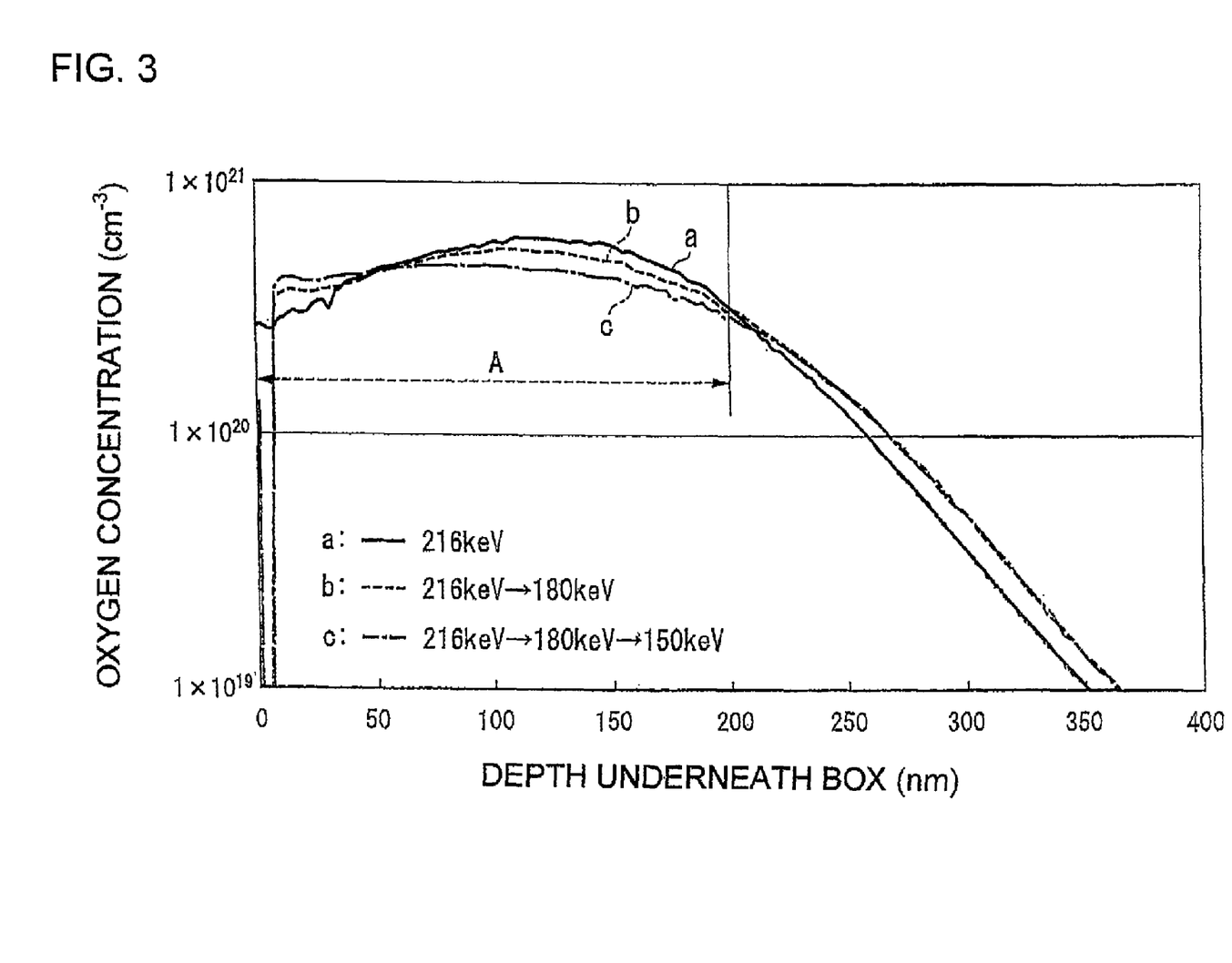
FIG. 3 is a graphical view used to explain a relationship between the frequency of oxygen ion implantation and an oxygen concentration distribution in a depth direction from a boundary between a BOX layer and a silicon layer underneath this BOX layer.

In the present example, an examination was first made of three types of SIMOX wafers in a state before heat treatment and different in the frequency of oxygen ion implantation, in order to investigate an oxygen concentration distribution in a depth direction in a predetermined depth region of a silicon layer. FIG. 3 is a graphical view used to explain the oxygen concentration distributions in the depth directions of silicon layers of SIMOX wafers after oxygen ion implantation and before heat treatment. The horizontal axis represents a depth (nm) from a boundary between a BOX layer and a silicon layer, whereas the vertical axis represents an oxygen concentration (/cm$^3$). The region shown by a two-headed arrow A in the figure represents a depth region 200 nm deep from the boundary between the BOX layer and the silicon layer (hereinafter referred to as the SF generation region A).

Here, an explanation will be made of a method for fabricating the above-described three types of wafers. First, a prepared SIMOX wafer was cleaned and dried, and then housed in an ion implantation apparatus to maintain the temperature of the SIMOX wafer at 50° C. Then, implantation energy was fixed to 216 keV and an ion dose was set to $1.3\times10^{16}$ atoms/cm$^2$ to implant oxygen ions. At this time, a current value detected by a current detection section of the ion implantation apparatus at the time of ion implantation was 30 mA. The SIMOX wafer thus obtained is specified as a SIMOX wafer "a".

On the other hand, in contrast to the SIMOX wafer "a", implantation energy was decreased stepwise to 216 keV and 180 keV in this order, ion doses at the respective times of ion implantation were all set to $6.5\times10^{15}$ atoms/cm$^2$, and a sum of ion doses at the two times of ion implantation was made equal to the ion dose of the SIMOX wafer "a", to implant oxygen ions. Other conditions were the same as those of the SIMOX wafer "a". The SIMOX wafer thus obtained is specified as a SIMOX wafer "b".

Furthermore, in contrast to the SIMOX wafers "a" and "b", implantation energy was decreased stepwise to 216 keV, 180 keV and 150 keV in this order, ion doses at the respective times of ion implantation were set to $7\times10^{15}$ atoms/cm², $3\times10^{15}$ atoms/cm² and $3\times10^{15}$ atoms/cm², respectively, and a sum of ion doses at the three times of ion implantation was made equal to the ion dose of the SIMOX wafer "a", to implant oxygen ions. Other conditions were the same as those of the SIMOX wafer "a". The SIMOX wafer thus obtained is specified as a SIMOX wafer "c".

For the SIMOX wafer "a", the SIMOX wafer "b" and the SIMOX wafer "c" thus obtained, oxygen concentration distributions in the depth direction of a silicon layer were measured using an SIMS. The SIMS is a secondary ion mass spectrometer, with which it is possible to examine the chemical and isotopic compositions of a sample by emitting a primary ion beam to the sample and counting the number of mass-separated secondary ions. Owing to a primary ion sputtering effect, it is also possible to perform a composition analysis of the sample in the depth direction thereof. FIG. 3 illustrates the result of measurement. Here, the oxygen concentration distributions of the SIMOX wafer "a", the SIMOX wafer "b" and the SIMOX wafer "c" are shown by a line "a", a line "b" and a line "c", respectively. From the result of FIG. 3, the oxygen concentration of the SIMOX wafer "a" subjected to one-time ion implantation peaked in an SF generation region A and distributed in a mountain-shaped manner. In contrast, there was observed the tendency that the rate of change in the oxygen concentration in the depth direction decreased as the frequency of ion implantation increased. From this tendency, it is understood that oxygen ions are supplied so as to distribute more uniformly in the depth direction with an increase in the frequency of ion implantation performed with different amounts of implantation energy.

Next, in order to evaluate an SF density in the SF generation region A for the SIMOX wafer "a" and the SIMOX wafer "c", the SIMOX wafer "a" and the SIMOX wafer "c" obtained by ion-implanting under the above-described conditions were taken out of the ion implantation apparatus, cleaned and dried, respectively and then housed in a heat treatment furnace. The wafers were retained inside for one hour with the temperature thereof raised to 1200° C., and then cooled down to room temperature. Subsequently, the SIMOX wafer "a" and the SIMOX wafer "c" taken out of the heat treatment furnace were respectively observed with respect to a transverse section and a longitudinal section of a silicon layer in the SF generation region A, using a TEM (approximately 60000× magnification). Then, an SF density was determined from the number of SFs confirmed by TEM images. As a result, in the case of the SIMOX wafer "a", the SF density had a value smaller than $1\times10^7$/cm² but larger than $1\times10^6$/cm². In contrast, in the case of the SIMOX wafer "c", it was confirmed that SFs completely disappeared from a TEM image and the SF density had a value smaller than $1\times10^6$/cm².

Example 5

In the present example, an evaluation was made of an SF density for a wafer obtained by implanting oxygen ions under the condition in which a total ion dose of the three-time ion implantation of the SIMOX wafer "c" was decreased, and then performing a heat treatment. Here, the implantation energy was decreased stepwise in the order of 216 keV, 180 keV and 150 keV, as in the case of the SIMOX wafer "c", ion doses at the respective times of ion implantation were all set to $2\times10^{15}$ atoms/cm², and the total ion dose of the three-time ion implantation was set to $6\times10^{15}$ atoms/cm². Other conditions including heat treatment were the same as those of the SIMOX wafer "a" and the SIMOX wafer "c" of Example 4. The SIMOX wafer thus obtained is specified as a SIMOX wafer "d".

Figure 4:
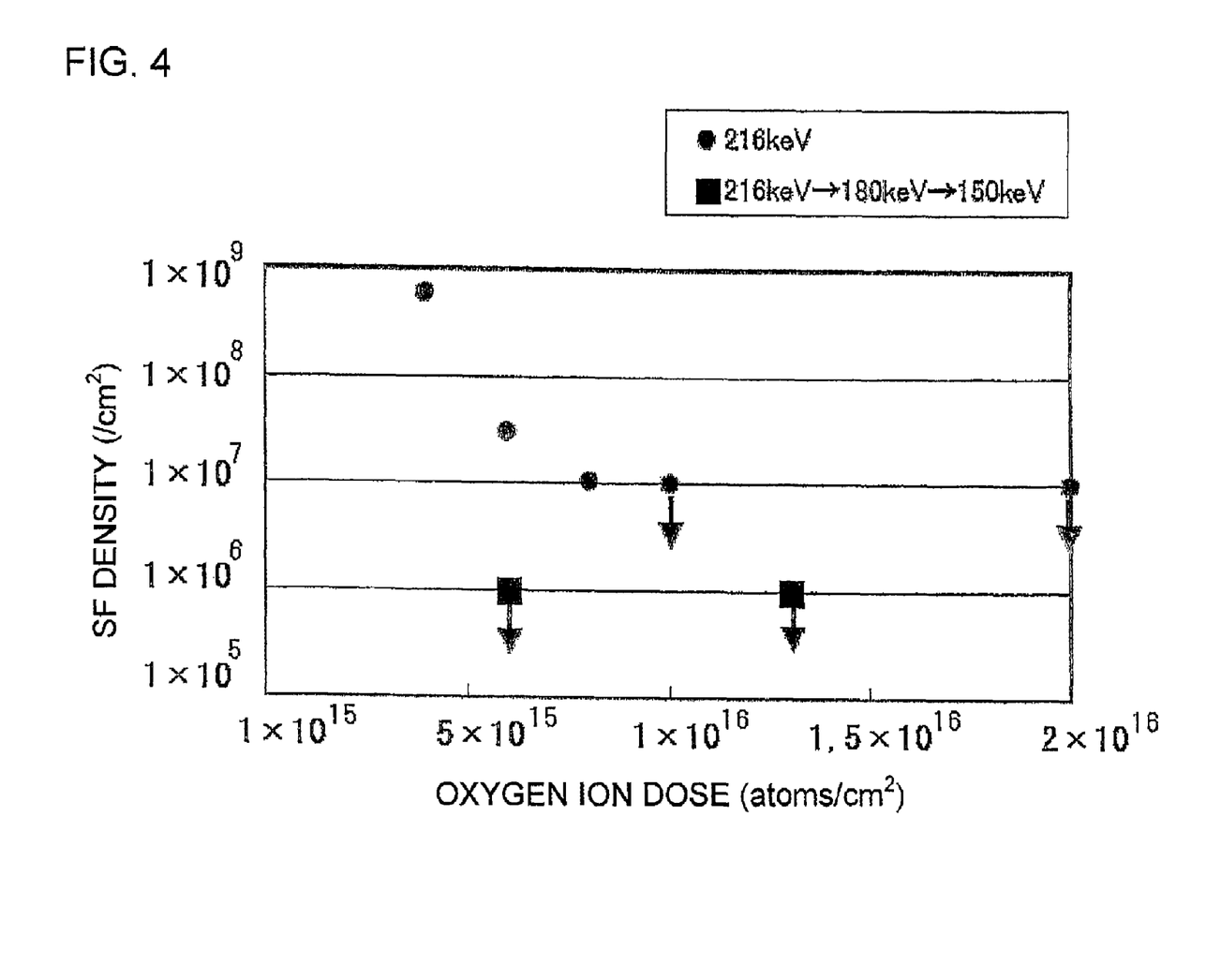
FIG. 4 is a graphical view used to explain a relationship between an oxygen ion dose and an SF density and a relationship between the frequency of oxygen ion implantation and an SF density.

Here, the result of determining the SF density of the SIMOX wafer "d" is represented by the symbol □ and is shown in FIG. 4, along with the SF density of the post-heat treatment SIMOX wafer "c". FIG. 4 is a graphical view used to explain a relationship between an oxygen ion dose implanted into the SIMOX wafer and an SF density. The horizontal axis of the figure represents the oxygen ion dose (atoms/cm²) and the vertical axis represents the SF density (/cm²) of a depth region of a silicon layer. The oxygen ion dose of each SIMOX wafer shows a total dose of three-time ion implantation. In addition, the depth region for the SF density refers to the SF generation region A of FIG. 3. The down-pointing arrow of the symbol □ represents that the SF density is lower than $1\times10^6$/cm². From this result, it has proved that the SIMOX wafer "d", like the SIMOX wafer "c", has an SF density lower than $1\times10^6$/cm².

Comparative Example 1

In the present comparative example, an evaluation was made of the SF density of a wafer obtained by fixing implantation energy to 216 keV and, under five ion implantation conditions different in ion dose, performing ion implantation only once for each condition, and then performing a heat treatment. Here, the ion doses were varied in five ways, i.e., $4\times10^{15}$ atoms/cm², $6\times10^{15}$ atoms/cm², $8\times10^{15}$ atoms/cm², $1\times10^{16}$ atoms/cm² and $2\times10^{16}$ atoms/cm². Other conditions including heat treatment were the same as those of the SIMOX wafer "a" and the SIMOX wafer "c" in Example 4. The results of determining SF densities for the respective five types of wafers thus obtained are represented by the symbol ○ and are shown in FIG. 4. The down-pointing arrow of the symbol ○ represents that the SF density ranges from a value smaller than $1\times10^7$/cm² to a value $1\times10^6$/cm² or larger.

From the results of FIG. 4, there was observed the tendency that the SF density decreased as the oxygen ion dose increased. It was not possible, however, to decrease the SF density to less than $1\times10^6$/cm² even if the oxygen ion dose was increased to $2\times10^{16}$ atoms/cm².

As is evident from the above-described results, if ion implantation is performed at one time, the SF density does not decrease below $1\times10^6$/cm² even if the ion dose is increased. In contrast, it has proved that, by performing ion implantation a plural number of times with different amounts of implantation energy and thereby implanting ions with the ion dose distributed, it is possible to decrease the SF density to below $1\times10^6$/cm² even if the total ion dose of ion implantation performed a plural number of times is decreased. As described above, by implanting ions separately a plural number of times with different amounts of implantation energy, it is possible to more efficiently utilize the implanted ions for the reduction of crystal defects.

What is claimed is:

1. A method for reducing crystal defects present in a silicon layer underneath a buried oxide film of a Separation by Implanted Oxygen (SIMOX) wafer, said method comprising:
  implanting ions from a surface of said SIMOX wafer into said silicon layer underneath said buried oxide film with a temperature of the pre-ion implantation SIMOX wafer being 50° C. or lower; and
  heating said SIMOX wafer following the ion implantation.

2. A method for reducing crystal defects present in a silicon layer underneath a buried oxide film of a Separation by Implanted Oxygen (SIMOX) wafer, said method comprising:
implanting ions from a surface of said SIMOX wafer into said silicon layer to collide said implanted ions against said crystal defects to destroy said crystal defects; and
heating said SIMOX wafer following the ion implantation to recrystallize said silicon layer.

3. The method for reducing the crystal defects in a SIMOX wafer according to claim 1, wherein said ions are energized so as to reach from a boundary between said buried oxide film and said silicon layer underneath said buried oxide film to a region at a preset depth of said silicon layer underneath said buried oxide film.

4. The method for reducing the crystal defects in a SIMOX wafer according to claim 1, wherein said ions to be implanted into said silicon layer are elements, from hydrogen to argon, in the periodic table of elements.

5. The method for reducing the crystal defects in a SIMOX wafer according to claim 1, wherein heating said SIMOX wafer following the ion implantation comprises heating said SIMOX wafer to a temperature of 1150° C. or higher but not higher than 1305° C.

6. The method for reducing the crystal defects in a SIMOX wafer according to claim 1, wherein an ion dose of the implanted ions is set to $5 \times 10^{15}$ atoms/cm$^2$ to $1.5 \times 10^{16}$ atoms/cm$^2$ and an implantation energy of the implanted ions is set to 150 keV to 220 keV.

7. The method for reducing the crystal defects in a SIMOX wafer according to claim 1, wherein implanting said ions comprises implanting said ions a plural number of times with different amounts of implantation energy.

8. The method for reducing the crystal defects in a SIMOX wafer according to claim 7, wherein an ion dose of the implanted ions is set to $5 \times 10^{15}$ atoms/cm$^2$ to $1.5 \times 10^{16}$ atoms/cm$^2$ and an implantation energy of the implanted ions is set to 150 keV to 220 keV.

9. A Separation by Implanted Oxygen (SIMOX) wafer in which a density of vacancy-type stacking faults in a range from a boundary between a buried oxide film formed within said SIMOX wafer and a silicon layer underneath said buried oxide film to a depth of 200 nm of said silicon layer is $1 \times 10^7$ atoms/cm$^2$ or lower.

10. The method for reducing the crystal defects in a SIMOX wafer according to claim 2, wherein said ions to be implanted into said silicon layer are elements, from hydrogen to argon, in the periodic table of elements.

11. The method for reducing the crystal defects in a SIMOX wafer according to claim 2, wherein heating said SIMOX wafer following the ion implantation comprises heating said SIMOX wafer to a temperature of 1150° C. or higher but not higher than 1305° C.

12. The method for reducing the crystal defects in a SIMOX wafer according to claim 2, wherein a temperature of said pre-ion implantation SIMOX wafer is 50° C. or lower, an ion dose of the implanted ions is set to $5 \times 10^{15}$ atoms/cm$^2$ to $1.5 \times 10^{16}$ atoms/cm$^2$ and an implantation energy of the implanted ions is set to 150 keV to 220 keV.

13. The method for reducing the crystal defects in a SIMOX wafer according to claim 2, wherein implanting said ions comprises implanting said ions a plural number of times with different amounts of implantation energy.

* * * * *